(12) United States Patent
Boomer

(10) Patent No.: US 7,932,751 B2
(45) Date of Patent: Apr. 26, 2011

(54) FREQUENCY MODE SELECTION DISCRIMINATOR AND LOW PASS FILTER

(75) Inventor: James B. Boomer, Monument, CO (US)

(73) Assignee: Fairchild Semiconductor Corporation, South Portland, ME (US)

(*) Notice: Subject to any disclaimer, the term of this patent is extended or adjusted under 35 U.S.C. 154(b) by 110 days.

(21) Appl. No.: 12/365,987

(22) Filed: Feb. 5, 2009

(65) Prior Publication Data

US 2009/0195271 A1 Aug. 6, 2009

Related U.S. Application Data

(60) Provisional application No. 61/026,555, filed on Feb. 6, 2008.

(51) Int. Cl.
*G01R 23/02* (2006.01)

(52) U.S. Cl. ............... 327/44; 327/46; 327/47; 327/49; 327/165; 327/166

(58) Field of Classification Search .................. 327/39, 327/44–49, 165–169
See application file for complete search history.

(56) References Cited

U.S. PATENT DOCUMENTS

| 4,847,577 A | * | 7/1989 | Gerhart et al. | 327/37 |
| 5,682,113 A | * | 10/1997 | Park et al. | 327/174 |

* cited by examiner

*Primary Examiner* — David Mis
(74) *Attorney, Agent, or Firm* — Cesari and McKenna, LLP

(57) ABSTRACT

A circuit is described that detects high and low frequencies and additional clock frequencies and outputs a signal that indicates a high, a low frequency or an additional mode. When in the low frequency low frequency mode signals are regenerated free of any high frequency signals from appearing on the filtered low frequency clock line. The rising and falling edges of the input clock are low pass filtered separately and then combined to generate a low frequency clock or the additional input clock and that retains the input clock pulse width and duty cycle.

13 Claims, 4 Drawing Sheets

FREQUENCY MODE SELECTION DISCRIMINATOR AND LOW PASS FILTER

RELATED APPLICATIONS

The present application claims the benefit of a U.S. Provisional Patent Application Ser. No. 61/026,555, filed Feb. 6, 2008 of common title, inventorship and ownership. The provisional application is hereby incorporated herein by reference.

BACKGROUND OF THE INVENTION

1. Field of the Invention

The present invention relates to frequency filtering and frequency discrimination to detect high speed and low speed modes.

2. Background Information

In communications applications wire conductors are often at a premium. In some systems high frequency clocks are may be found time sharing the same wire connection with lower speed clocks. Such systems typically use a reference oscillator set between incoming frequencies. The incoming frequency is compared to the reference oscillator to detect and indicate high or low frequency mode operation. In systems that operate with a high and a low speed clock, RC (resistor/capacitor) filters are often employed.

Limitations of known systems include: high speed clock signals leaking through (due to latency and/or lag associated the frequency changes) during a transition from a lower to a higher clock frequency; distorting clock duty cycles due to RC filtering and circuit component mismatches; and excessive power dissipation.

The present invention addresses these limitations above while providing an advantage of a smaller circuitry footprint and reduced power dissipation due to elimination of the free running oscillator.

SUMMARY OF THE INVENTION

The present invention addresses the limitations of the prior art by filtering the rising edge of the clock and the falling edge of the clock. Logic circuits then operate with the low pass filtered clock edges to discriminate whether a high speed or a low speed clock is input. Inputting a high speed clock defines a high speed mode and inputting a low speed clock defines a low speed mode without implementing a separate mode indicator.

The low pass filtered rising edge, the low pass filtered falling edge, and the low frequency clock are combined in a discriminator and logic circuits to determine the mode. And when in the low speed mode the low speed clock is regenerate and output having about the same pulse width and duty cycle as the input low frequency clock without any glitches or high speed clock signals from coming through.

In other embodiment, illustratively, the clock input may include more that two frequencies. In this example multiple additional rising edge and falling edge low pass filters, similar to items 45 and 50 of FIG. 1A, but with different but corresponding time constants may be employed. In this example, there will be as many modes determined as there are frequencies anticipated. In such case clock regeneration logic and discriminators similar to that of items 55 (regeneration) and discriminators 60 (mode discriminator) of FIG. 1A will be employed to regenerate the clock frequency that matches the mode. In each case, since the clock is regenerated and not passed through directly, there will be no glitches or feed through from the other clock frequencies.

Illustratively, the invention provides a latching mechanism to produce an output low frequency clock that has about the same duty cycle as the input clock and a counting mechanism to ensure high frequency to low frequency and low frequency to high frequency transitions do not allow extraneous high frequency clocks to emerge on the low frequency clock output.

The present invention regenerates the clock, except not the high speed clock, that matches the mode while preventing the high speed clock from leaking through onto the lower speed clocks during a transition. The present invention also provides for reduced power consumption by not employing an oscillator as found in prior art systems.

Illustratively, high speed clocks may be used with LCD data and low speed clocks with I2C data.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1A:
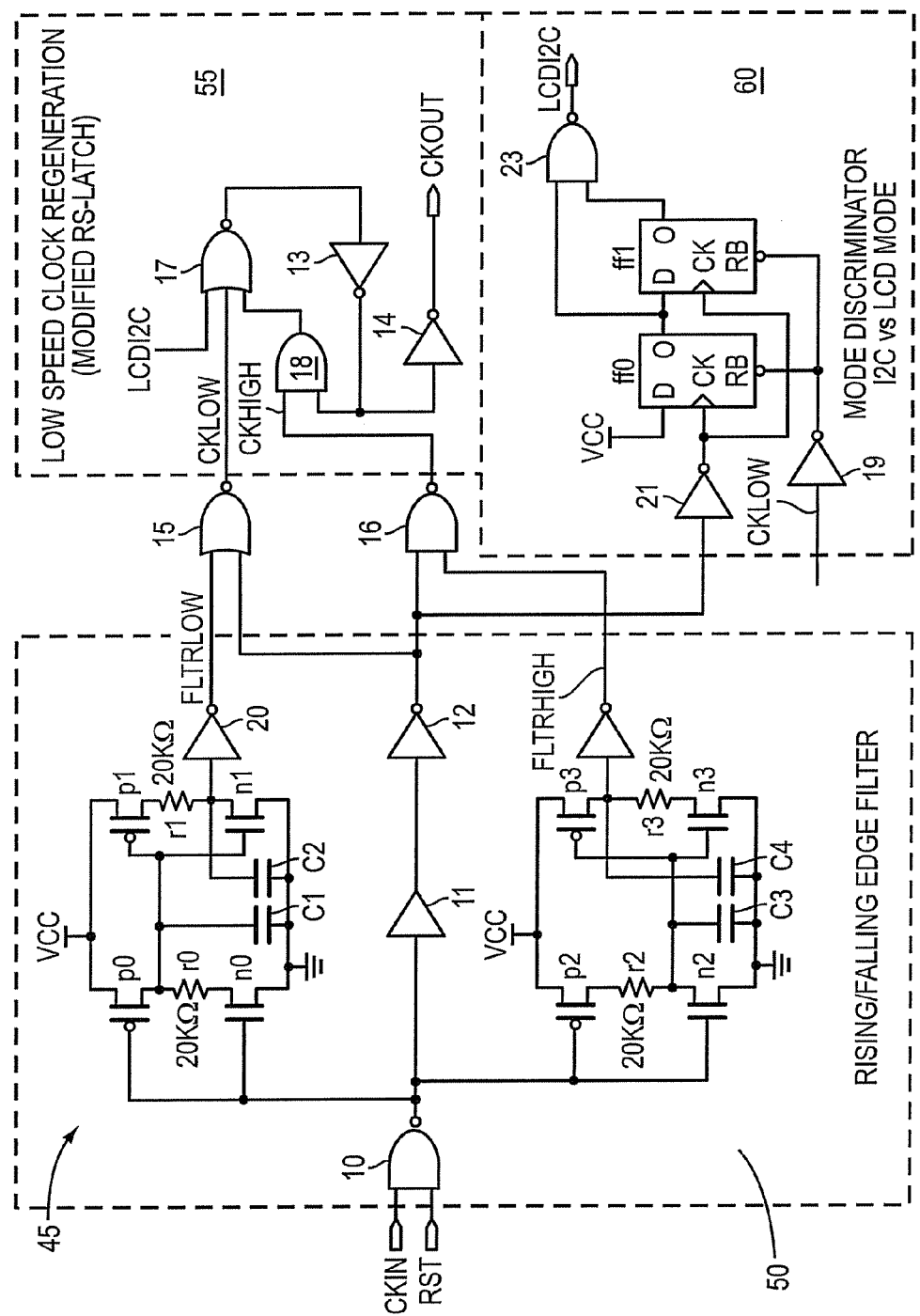
FIG. 1A is a block schematic diagram illustrating the present invention.

Illustrating the discrimination between a high and a low frequency clock using FIG. 1A, CKIN travels through the NAND 10 (RST_assumed high) and is split between the circuit 45 and 50. Circuit 45 filters and thus delays the falling edge of CKIN but not the rising edge of CKIN, and circuit 50 filters and delays the rising edge but not the falling edge of CKIN. Each of circuits 45 and 50 employs RC filters. Illustratively, the resistors r0, r1, r2 and r3 are shown as individual resistors (see FIG. 4), but in some applications they are series/parallel banks of resistors that may have a bias connection to ground or to some other power supply level.

FIG. 1A is a schematic block diagram illustrating the present invention. A high and a low frequency clock are described with two corresponding modes, but additional input clocks of other frequencies may be implemented where corresponding other modes are discriminated, and where those other clock frequencies may be regenerated. For example, the several additional low frequency clock signals that may sequentially appear on the CKIN line where their frequencies are discriminated by the additional low pass filtering modules. See FIG. 1B and the description below.

Figure 2:
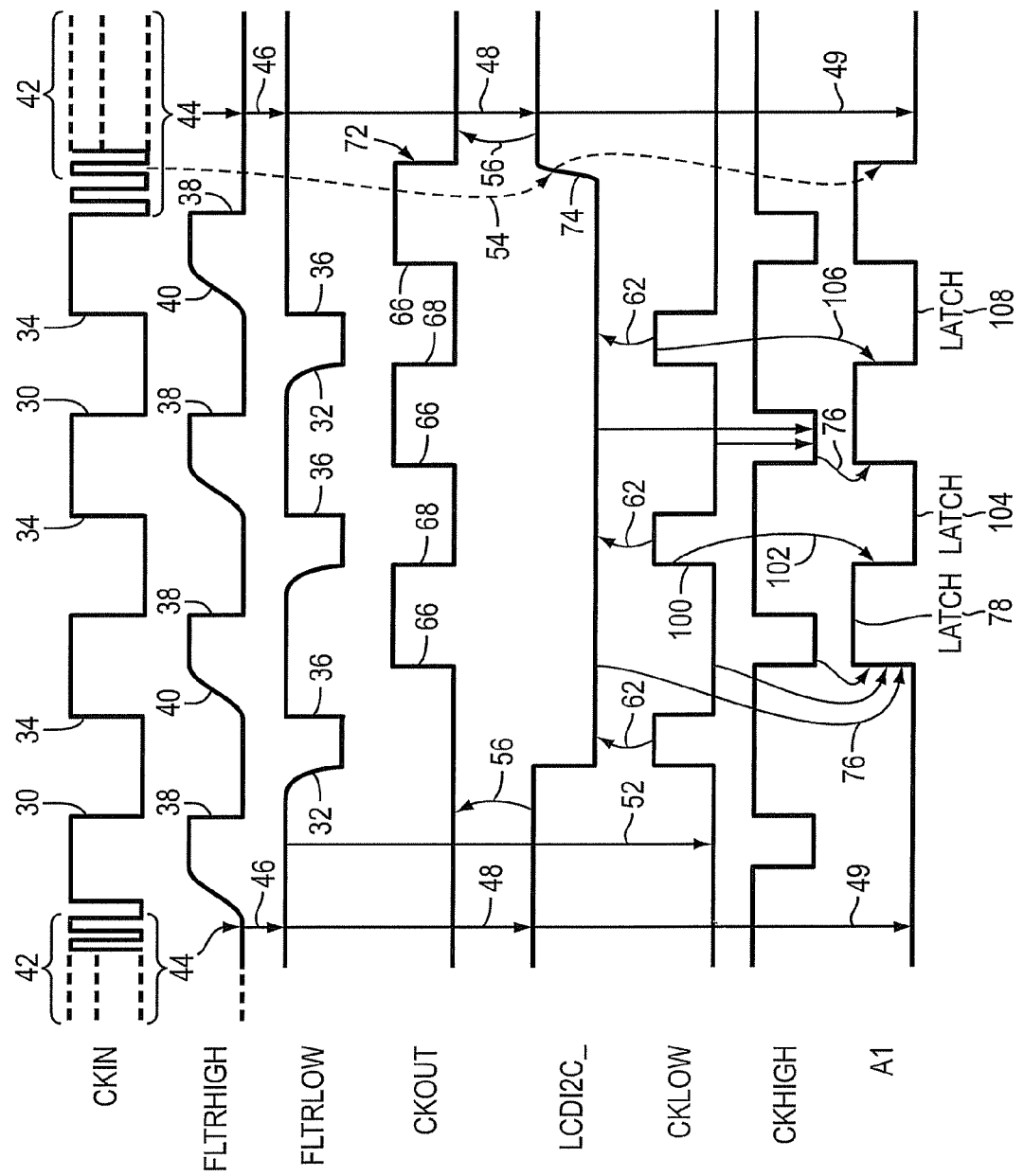
FIG. 2 has timing charts of signals found in FIG. 1A.

FIG. 1A and FIG. 2 are describe, as an example of the present invention in more detail, with respect to only two CKIN'S, one low and one high speed, when a low frequency CKIN transitions from high to low 30, FLTRLOW follows 32 (low pass filtered) after a delay caused by traveling through the RC delays of r0, C1, r1 and C2 and turning on transistors n0 and p1 of circuit 45. See associated low going edges 30 and the RC delayed and rounded edge of FLTRLOW 32, and that the width of FLTRLOW is about 1.5 times the width of CKIN due to the low pass filtering. The final resistor values for r0, r1 are selected, see FIG. 4, to provide the about ½ pulse width delay by prior knowledge of the CKIN pulse width. The selected value may be selected by a late deposited metal layer that makes connections between and among the bank of resistors, ground, and the transistors of circuit 45. The resistors r2 and r3 of circuit 50 are also selected as are r0 and r1 and formed from a similar bank of resistors.

Note that when CKIN goes high 34, FLTRLOW edge goes high 36 with little delay and no rounding, and when CKIN goes low FLTRHIGH goes low 38 with little delay and no rounding. This occurs since the RC's of circuits 45 and 50 are not active when transistors p0 and n1 of circuit 45 and n2 and p3 of circuit 50 turn on.

When CKIN goes high 34, FLTRHIGH 40 goes high but delayed via circuit 50, see edges 40 of FIG. 2. The delay and rounding of FLTRHIGH as it rises is due to RC's (r2, C4, and r3 and C3).

Referring to circuit 45, when the CKIN is at high speed, 42, the first rising edges of CKIN will drive the FLTRLOW signal high 44, and the next rising edge of CKIN will occur before the RC delayed signal can drive FLTRLOW low. So when CKIN is high frequency, the rising edges of CKIN drives FLTRLOW on and it remains on as long as CKIN is at a high frequency. The RC component values are selected with reference to the expected high and low frequencies of CKIN so that the above condition is true.

Similar to the operation of circuit 45, when CKIN is high speed 42, FLTRHIGH goes low 38 with the falling edge of CKIN and remains low 44 since the RC delays are long enough to prevent the transistors p2 and n3 from driving FLTRHIGH high.

In FIG. 1A resistors, r0, r1, r2, and r3 and the capacitors C1, C2, C3, and C4 together are designed to filter out a pulse equal to about one fourth of the period of the center frequency between the high and the low CKIN frequencies. Those skilled in the art will understand what component values are needed and how these values should be implemented. Capacitance values include those inherent in the devices used in the circuits 45 and 50.

FIG. 1A, circuit 55, Low Speed Clock Regeneration, outputs CKOUT, a low speed (low frequency) output clock. NOR gate 15 takes FLTRLOW and CKIN1 (CKIN after traveling through gates 10, 11 and 12) and outputs CKLOW, that is input to NOR gate 17. Meanwhile, NAND 16 takes CKIN1 and FLTRHIGH and outputs CKHIGH that is fed to AND 18. Note that gate 13 feeds back to gate 17, forming a latching connection, and that at high frequencies, CKLOW is always low (since FLTRLOW is always high) and CKHIGH is always high (since FLTRHIGH is low). This leaves the RS latch of gates 30, 17 and 13 in its last state.

In circuit 55, when CKIN is a high frequency, LCDI2C_ (low true signal from Mode Discriminator 60) will be high 46 forcing the output A1 low, the output of inverter 13 high, and thus the output of inverter 14, CKOUT, low. The CKHIGH input to AND gate 18 will be blocked at the NOR 17 from affecting CLKOUT. LCD12C_ may be viewed as a HIGH/LOW mode indicator, where LCD12C_ high refers to a high frequency mode and low to a low frequency mode.

As mentioned above, circuit 60 of FIG. 1A forms a mode discriminator. When CKIN is a high frequency, FLTRLOW remains high 46(as discussed above) holding CKLOW low, and, via inverter 19, the flip flops, ff0 and ff1, are allowed to change state. CKIN via integrated circuits 10, 11, 12 and 21 drives the clock inputs to the flops, ff0 and ff1. With the D-inputs as shown, If CKLOW has reset the ff0 and ff1 flops, but then goes low, the second CKIN signal edge will set both flops, and LCD12C_ goes high 54 via gate 23. So the first high frequency clock cannot get through to the CLKOUT (due to LCD12C_ being low), and the LCD12C_ goes high keeping CLKOUT low and preventing the CKIN from leaking through to CLKOUT.

Referring to FIGS. 1A and 2, with CKIN at a low frequency, CKLOW toggles each with CKIN resetting ff0 and ff1 and keeping LCD12C_ low 62. This enables the circuit 55 to output the filtered low frequency CKOUT signal. Of note is that the rising edge 66 (FIG. 2) of CKOUT is generated from the RC filtered rising edge 44 of FLTRHIGH, and the falling edge 68 of CKOUT is generated from the RC filtered falling edge of FLTRLOW. The last falling CLKOUT edge is due to LCD12C_ going low 54 after the flops are both set by the second high speed CKIN signal.

The RC filters act to minimize mismatches between NMOS and PMOS components and better preserve the same CKIN duty cycle in the generated CKOUT. See FIG. 2.

Referencing FIG. 2, when CKIN is a low frequency, CKLOW goes high and resets ff0 and ff1 and drives LCD122C_ low. The filtered CKLOW and CLHIGH will recreate a delayed CLKOUT with the same duty cycle as the low frequency CKIN.

When LCD12C_is low, CKLOW is low, CKHIGH is low, item 76, A1 and CKOUT go high, and the high A1 (via inverter 13) presents a low to the AND gate 18 thus latching 78 A1 high. CKLOW going high 100 sets A1 low 102. A1 low and CKHIGH high latches A1 low 104. A1 is later driven high when the combination 76 occurs again. This repeats as CKLOW high drive A1 low 104 and A1 is again latched 108.

LCD12C_ (HIGH/LOW mode) when high indicates a high frequency mode and when low a low frequency mode, obviating the need of a separate mode signal. In other applications, this signal may be the only signal employed.

Figure 1B:
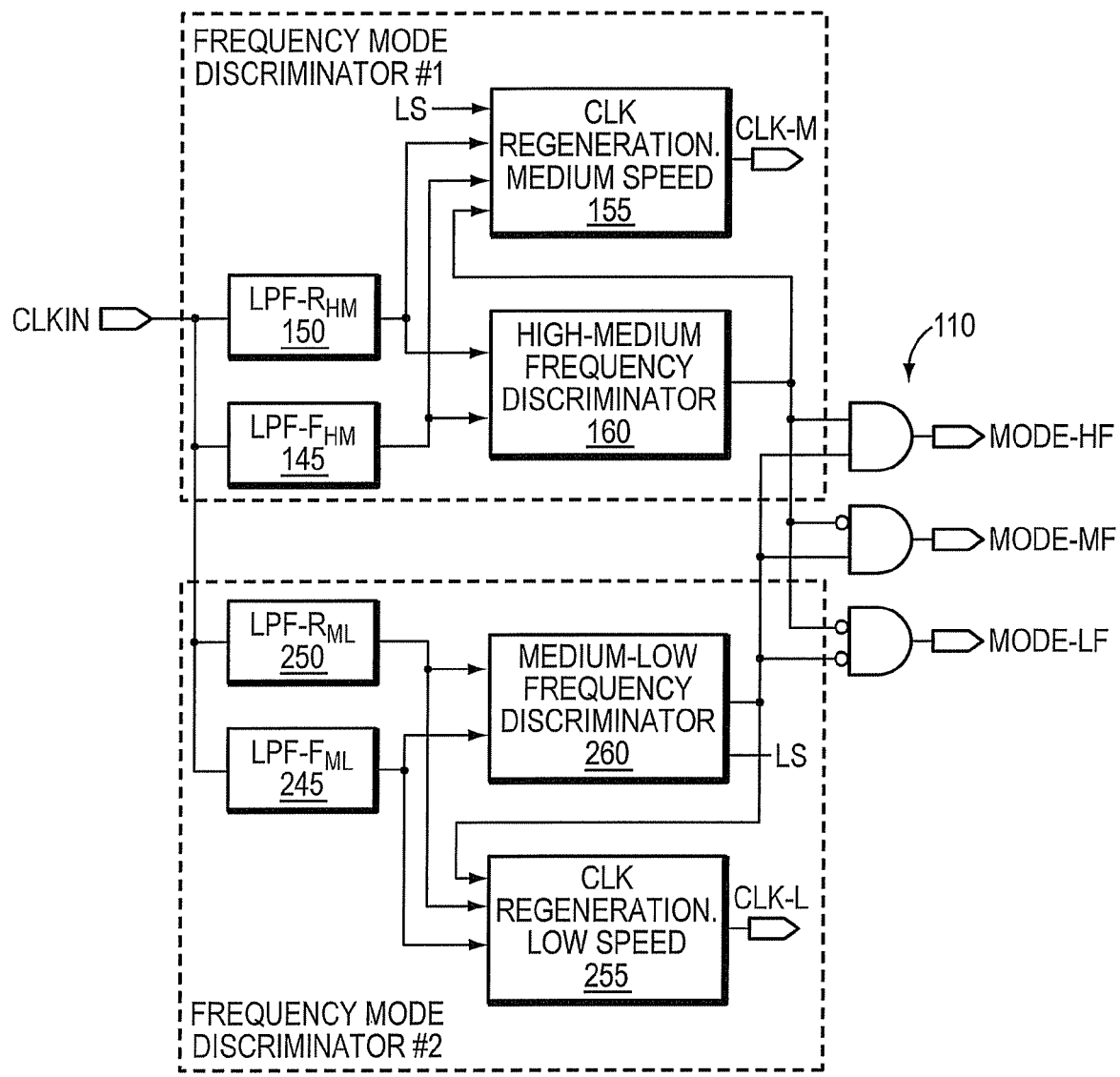
FIG. 1B is a block diagram showing multiple input frequencies.

FIG. 1B illustrates in block diagram form the addition of another frequency. The details in the blocks of FIG. 1B are similar to those in FIG. 1A. For example in FIG. 1B, items 145 and 245 are similar to item 45 of FIG. 1A, and items 150 and 250 are similar to items 50 in FIG. 1A. Correspondingly, in FIG. 1B items 155, 255, 160 and 260 are similar to items 55 and 60, respectively from FIG. 1A. "Similar" indicates that one skilled in the art would understand how to design and interconnect the blocks of FIG. 1B.

In FIG. 1B three frequencies, low, medium and high will appear on the CLKIN line. In the Frequency Mode Discriminator #1 operates similarly to the circuitry of FIG. 1A, Item 150 will low pass filter the medium frequency rising edge and item 145 low pass filters the falling edge of the CLKIN. Discriminator 160 discriminates the medium frequency from high frequency signal and regenerates 155 the medium frequency at CLK-M. Since the low frequency would also operate via item 160 (since 150, 145 and 160 would discriminate the high the low as well as the high from medium), the LS signal (from the Medium-Low Frequency Discriminator 260) will prevent the CLK-M from occurring.

Frequency Mode Discriminator #2 also operates as does the circuitry of FIG. 1A. Item 250 will low pass filter the low frequency rising edge and item 245 low pass filters the falling edge of the CLKIN. Discriminator 260 discriminates the low frequency from medium frequency signal and regenerates 255 the low frequency CLK-L.

The gating 110 combines the outputs of the discriminators 155 and 255 to provide three modes, MODE-HF (high frequency); MODE-MF (medium frequency) and MODE-LF (low frequency).

Figure 3:
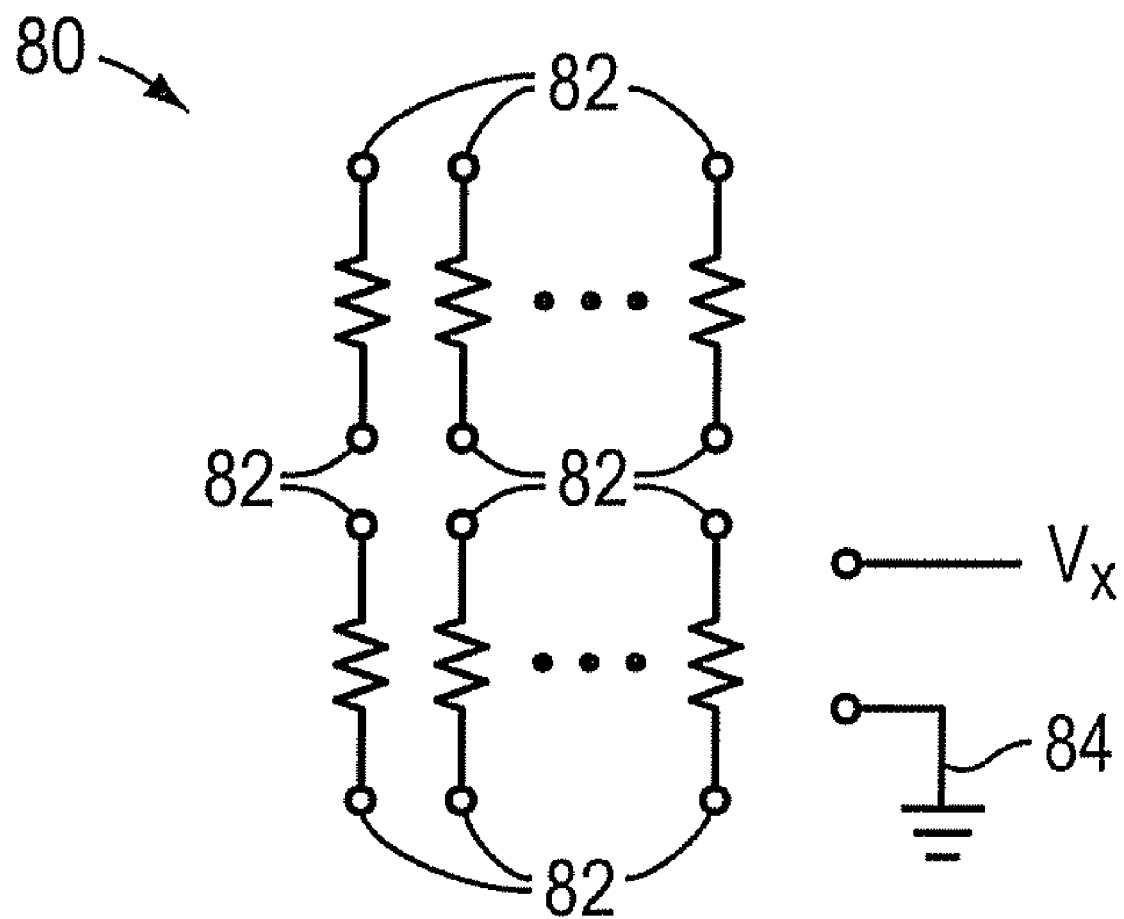
FIG. 3 is a representative resistor bank that may be used with the present invention.

FIG. 3 illustrates resistors r0, r1, r2, and r3 being designed as a bank 80 of individual resistors with contact points 82 that allows a metallization layer to make connections among and between the resistors, ground 84, a power supply 86, if needed, and the components of circuits 45 and 50. This allows a flexibility to present a wide range of bias voltages and RC time constants for different applications with different CKIN speeds. In other illustrative embodiments, banks of capacitors or other combinations of banks of resistors and banks of capacitors may be used. In practice higher value resistors are preferred over high value capacitors due to lower power dissipation.

Although not shown, the CKIN could be parsed logically so that the high speed clock may be directed to second high speed clock output (not shown). That is, the high speed clock may be presented on this second output. When the low speed clock is on the CKIN line, the high speed clock second output may be held constant and none of the low speed clock will appear on the high speed clock output.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A method of discriminating between a high and a low frequency input clock signal sequentially appearing on the same clock line, the method comprising the steps of:
   low pass filtering of the rising and the falling edges of the input clock signal;
   frequency discriminating and logical gating of the input clock signal and the low pass filtered falling and rising edges of the input clock, wherein, in response thereto, creating a low frequency mode and a high frequency mode.

2. The method of claim 1 further comprising the steps of:
   regenerating a low speed clock when in the low speed mode, wherein the regenerated low speed clock has about the same pulse width and duty cycle as the low speed input clock with no glitches or high speed clock edges or signals.

3. The method of claim 1 further comprising the steps of:
   additional low pass filtering of the rising and the falling edges of the input clock signal;
   frequency discriminating and logical gating of the input clock signal and the low pass filtered rising and falling edges and the additional low pass filtering of the rising and falling edges of the input clock; wherein, in response thereto,
   creating additional frequency modes corresponding to the additional low pass filtering of the rising and falling edges of the input clock.

4. The method of claim 3 further comprising the step of regenerating the additional frequency clocks when in the additional frequency modes.

5. The method of claim 1 further comprising the step of setting time constants of the low pass filters to reach logic thresholds at about the same times;
   wherein the regenerated low frequency clock preserves the pulse width and duty cycle of the low frequency input clock.

6. The method of claim 1 further comprising the step of latching the mode state.

7. The method of claim 6 further comprising the step of counting a number of clock signals before outputting any clock signal.

8. A frequency mode discriminator comprising:
   a first low pass filter for the rising and the falling edges of the input clock signal;
   a second low pass filter for the rising and the falling edges of the input clock signal;
   a frequency discriminator and logical gates that input the input clock signal and the low pass filtered rising and falling edges of the input clock, wherein, in response thereto, a low frequency and a high frequency mode are formed.

9. The frequency discriminator of claim 8 further comprising a regenerator for the low speed clock with about the same pulse width and duty cycle as the low speed input clock with no glitches or high speed clock edges or signals.

10. The frequency discriminator of claim 8 further comprising
   additional low pass filters for the rising and the falling edges of the input clock signal;
   wherein the frequency discriminator and logical gates of the input clock signal and the low pass filtered rising and falling edges and the additional low pass filtering of the rising and falling edges of the input clock; wherein, in response thereto, additional frequency modes are formed that correspond to the additional low pass filtering of the rising and falling edges of the input clock.

11. The frequency discriminator of claim 8 wherein the low pass filters comprise time constants wherein the time constants are configured to reach the logic thresholds at about the same times; wherein the clock out signal is gated out preserving the pulse width duty cycle of the low frequency input clock.

12. The frequency discriminator of claim 8 wherein the logical gates comprises a latching circuit that latches the mode.

13. The frequency discriminator of claim 8 further comprising a counter that counts a number of clock signals before outputting any clock signal.

* * * * *